United States Patent
Akutagawa et al.

(10) Patent No.: US 9,484,932 B2
(45) Date of Patent: Nov. 1, 2016

(54) SIGNAL GENERATION CIRCUIT AND ELECTRONIC APPARATUS

(71) Applicant: Sony Semiconductor Solutions Corporation, Kanagawa (JP)

(72) Inventors: Kazuki Akutagawa, Kanagawa (JP); Yasunori Tsukuda, Kanagawa (JP); Eiichi Nakamoto, Kanagawa (JP); Akito Sekiya, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 14/611,820

(22) Filed: Feb. 2, 2015

(65) Prior Publication Data

US 2015/0229313 A1    Aug. 13, 2015

(30) Foreign Application Priority Data

Feb. 10, 2014    (JP) .................................. 2014-023332

(51) Int. Cl.
*H03L 7/081* (2006.01)
*H03L 7/22* (2006.01)

(52) U.S. Cl.
CPC ................. *H03L 7/081* (2013.01); *H03L 7/22* (2013.01); *H03L 2207/50* (2013.01)

(58) Field of Classification Search
CPC ......... H03L 7/081; H03L 7/099; H03L 7/22; H03L 7/23; H03L 7/24; H03L 7/00; H03L 7/097
USPC ......... 327/156, 158, 161; 375/371, 373, 376
See application file for complete search history.

(56) References Cited

U.S. PATENT DOCUMENTS

| | | | | | |
|---|---|---|---|---|---|
| 5,757,240 | A | * | 5/1998 | Boerstler | H03K 3/0315 331/177 R |
| 5,818,365 | A | * | 10/1998 | Hush | H03L 7/08 341/100 |
| 6,483,886 | B1 | * | 11/2002 | Sung | H03K 19/1774 327/157 |
| 8,952,736 | B1 | * | 2/2015 | Evans | H03L 7/08 327/147 |
| 2007/0285140 | A1 | * | 12/2007 | Kubo | H03K 7/08 327/182 |
| 2012/0025918 | A1 | * | 2/2012 | Wang | H03L 7/0996 331/25 |

FOREIGN PATENT DOCUMENTS

JP    2013-005050    1/2013

* cited by examiner

*Primary Examiner* — John Poos
(74) *Attorney, Agent, or Firm* — Michael Best & Friedrich LLP

(57) ABSTRACT

A signal generation circuit includes a phase difference detector configured to detect a phase difference between a certain oscillation signal of a plurality of oscillation signals and a predetermined reference signal; an oscillator to which a plurality of delay elements are connected annularly, the oscillator being configured to generate the plurality of oscillation signals depending on the detected phase difference; a low-speed signal generation circuit configured to generate a low-speed signal having a lower frequency than the oscillation signal; a detection circuit configured to detect a difference between a predetermined reference timing and a timing at which the low-speed signal has changed; a selection unit configured to select the oscillation signal so that the phase difference with respect to the reference signal is close to the detected difference; and an output unit configured to output the generated low-speed signal in synchronization with the selected oscillation signal.

10 Claims, 9 Drawing Sheets

SIGNAL GENERATION CIRCUIT AND ELECTRONIC APPARATUS

CROSS REFERENCE TO RELATED APPLICATIONS

This application claims the benefit of Japanese Priority Patent Application JP 2014-023332 filed Feb. 10, 2014, the entire contents of which are incorporated herein by reference.

BACKGROUND

The present disclosure relates to a signal generation circuit and an electronic apparatus, and particularly to a signal generation circuit and an electronic apparatus that generate a clock signal in which jitter is reduced.

In the past, a clock generation circuit has been used to generate clock signals having various frequencies in an electronic apparatus. For example, a clock generation apparatus including a numerically controlled oscillator, a rounding module, a delay-locked loop (DLL), a multiplexer, and a flip-flop is proposed (see, for example, Japanese Patent Application Laid-open No. 2013-005050). The numerically controlled oscillator in the clock generation apparatus generates a clock signal NCOCLK based on a signal that represents a phase difference. The rounding module detects jitter in the clock signal NCOCLK.

Moreover, the DLL includes a phase comparator and a plurality of stages of delay elements. The phase comparator detects a phase difference between the signal supplied from the delay element in the final stage and a reference clock signal MCLK. Then, the plurality of stages of delay elements delay the reference clock signal MCLK by the delay time period depending on the detected phase difference, and generates a plurality of clock signals DCLK having different phases. Moreover, the multiplexer selects any one of the clock signals DCLK based on the jitter detected by the rounding module. The flip-flop holds the clock signal NCOCLK and outputs the held clock signal NCOCLK in synchronization with the selected clock signal DCLK (in other words, by retiming).

As described above, jitter is reduced because the flip-flop performs retiming on the clock signal NCOCLK based on the detected jitter.

SUMMARY

In the above-mentioned existing technique, however, it may be impossible to reduce jitter sufficiently. This is because a stationary phase error occurs in the DLL in the above-mentioned circuit. The stationary phase error is a phase error in which the phase of the clock signal DCLK supplied from the delay element in the final stage in the DLL does not match the phase of the reference clock signal MCLK stationarily due to the influence of offset voltage generated in the phase comparator in the DLL, or the like. The stationary phase error causes variability in the respective edge intervals between the plurality of clock signals DCLK, and jitter is caused in the clock signal NCOCLK on which retiming is performed by the clock signals DCLK.

The present disclosure has been made in view of the above circumstances, and it is desirable to improve the quality of a signal.

According to a first embodiment of the present disclosure, there is provided a signal generation circuit including a phase difference detector configured to detect a phase difference between a certain oscillation signal of a plurality of oscillation signals and a predetermined reference signal, an oscillator to which a plurality of delay elements are connected annularly, the oscillator being configured to generate the plurality of oscillation signals depending on the detected phase difference, a low-speed signal generation circuit configured to generate a low-speed signal having a lower frequency than the oscillation signal, a detection circuit configured to detect a difference between a predetermined reference timing and a timing at which the low-speed signal has changed, a selection unit configured to select the oscillation signal so that the phase difference with respect to the reference signal is close to the detected difference, and an output unit configured to output the generated low-speed signal in synchronization with the selected oscillation signal. Accordingly, it provides an operation in which a low-speed signal is output in synchronization with an oscillation signal generated by an oscillator to which a plurality of delay elements are connected annularly.

Moreover, in the first embodiment, the low-speed signal generation circuit may generate the low-speed signal in synchronization with an operation signal that has divided any one of the plurality of oscillation signals. Accordingly, it provides an operation in which a low-speed signal is generated in synchronization with an operation signal that has divided any one of a plurality of oscillation signals.

Moreover, in the first embodiment, the signal generation circuit may further include an operation signal generation circuit configured to generate a signal in synchronization with the reference signal as an operation signal, the low-speed signal generation circuit being configured to generate the low-speed signal in synchronization with the operation signal. Accordingly, it provides an operation in which a low-speed signal is generated in synchronization with an operation signal generated by an operation signal generation circuit.

Moreover, in the first embodiment, the low-speed signal generation circuit may include an integrator configured to generate an integration value by integrating an input value in synchronization with a predetermined operation signal, and a low-speed signal generator configured to generate, as the low-speed signal, a signal that represents whether or not the integration value exceeds a predetermined value representing the reference timing in synchronization with the operation signal, and the detection circuit may detect a difference between a maximum value of the integration value in a cycle of the low-speed signal and the predetermined value. Accordingly, it provides an operation in which the difference between the maximum value of an integration value in the cycle of a low-speed signal and a predetermined value is detected.

Moreover, in the first embodiment, the signal generation circuit may further include a phase comparison circuit configured to compare a phase of an input signal and a phase of the output low-speed signal, and to supply the phase difference there between, the low-speed signal generation circuit being configured to generate the low-speed signal based on the supplied phase difference. Accordingly, it provides an operation in which a low-speed signal is generated based on the phase difference between an input signal and an output low-speed signal.

Moreover, according to a second embodiment of the present disclosure, there is provided an electronic apparatus including a phase difference detector configured to detect a phase difference between a certain oscillation signal of a plurality of oscillation signals and a predetermined reference signal, an oscillator to which a plurality of delay elements are connected annularly, the oscillator being configured to generate the plurality of oscillation signals depending on the detected phase difference, a low-speed signal generation circuit configured to generate a low-speed signal having a lower frequency than the oscillation signal, a detection circuit configured to detect a difference between a predetermined reference timing and a timing at which the low-speed signal has changed, a selection unit configured to select the oscillation signal so that the phase difference with respect to the reference signal is close to the detected difference, an output unit configured to output the generated low-speed signal in synchronization with the selected oscillation signal, and an operation circuit configured to operate in synchronization with the output low-speed signal. Accordingly, it provides an operation in which a low-speed signal is generated in synchronization with an oscillation signal generated by an oscillator to which a plurality of delay elements are connected annularly.

According to the present disclosure, it is possible to achieve such excellent effects that the quality of a signal is improved. It should be noted that the effects described above are not necessarily restrictive, and may be any of those described in the present disclosure.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments for carrying out the present disclosure (hereinafter, referred to as embodiments) will be described with reference to the drawings. The description will be made in the following order.
1. First embodiment (example in which a clock signal is output in synchronization with an oscillation signal)
2. Second embodiment (example in which a clock signal is generated in synchronization with a signal that has divided an oscillation signal and the generated clock signal is output in synchronization with an oscillation signal)

1. First Embodiment

Configuration Example of Electronic Apparatus

Figure 1:
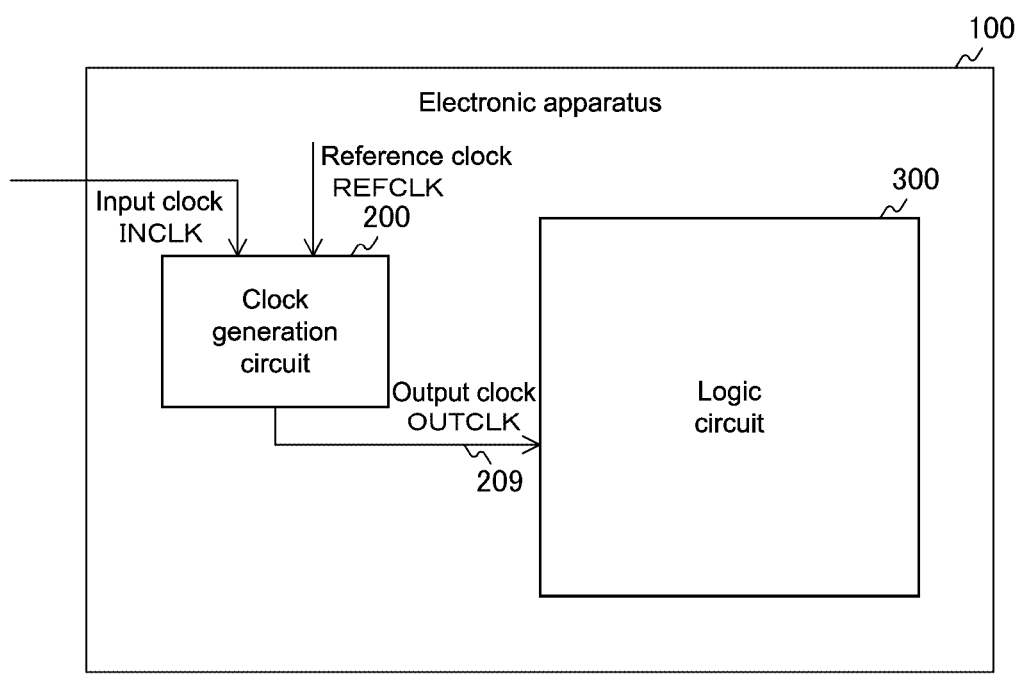
FIG. 1 is a block diagram showing a configuration example of an electronic apparatus according to a first embodiment of the present disclosure.

FIG. 1 is a block diagram showing a configuration example of an electronic apparatus 100 according to an embodiment of the present disclosure. The electronic apparatus 100 is an apparatus that performs a predetermined process such as an image process, and includes a clock generation circuit 200 and a logic circuit 300. To the electronic apparatus 100, an input clock signal INCLK is input. For example, a horizontal synchronous signal or a vertical synchronous signal is input as the input clock signal INCLK. Moreover, jitter may be caused in the input clock signal INCLK. It should be noted that the jitter represents that the phase of a positive-going edge or a negative-going edge of a clock signal is not at a constant interval but varies. Hereinafter, the difference between the timing of the positive-going edge or negative-going edge of a clock signal and the ideal timing of a constant interval is referred to as "jitter amount."

The clock generation circuit 200 is configured to use a reference clock signal REFCLK having a higher frequency than the input clock signal INCLK to detect the jitter amount of the input clock signal INCLK and to generate an output clock signal OUTCLK in which jitter is reduced. The clock generation circuit 200 is configured to supply the generated output clock signal OUTCLK to the logic circuit 300 via a signal line 209.

The logic circuit 300 is configured to perform a predetermined process such as an image process in synchronization with the output clock signal OUTCLK. It should be noted that the logic circuit 300 is an example of an operation circuit according to an embodiment of the present disclosure. Moreover, the clock generation circuit 200 is an example of a signal generation circuit according to an embodiment of the present disclosure.

Configuration Example of Clock Generation Circuit

Figure 2:
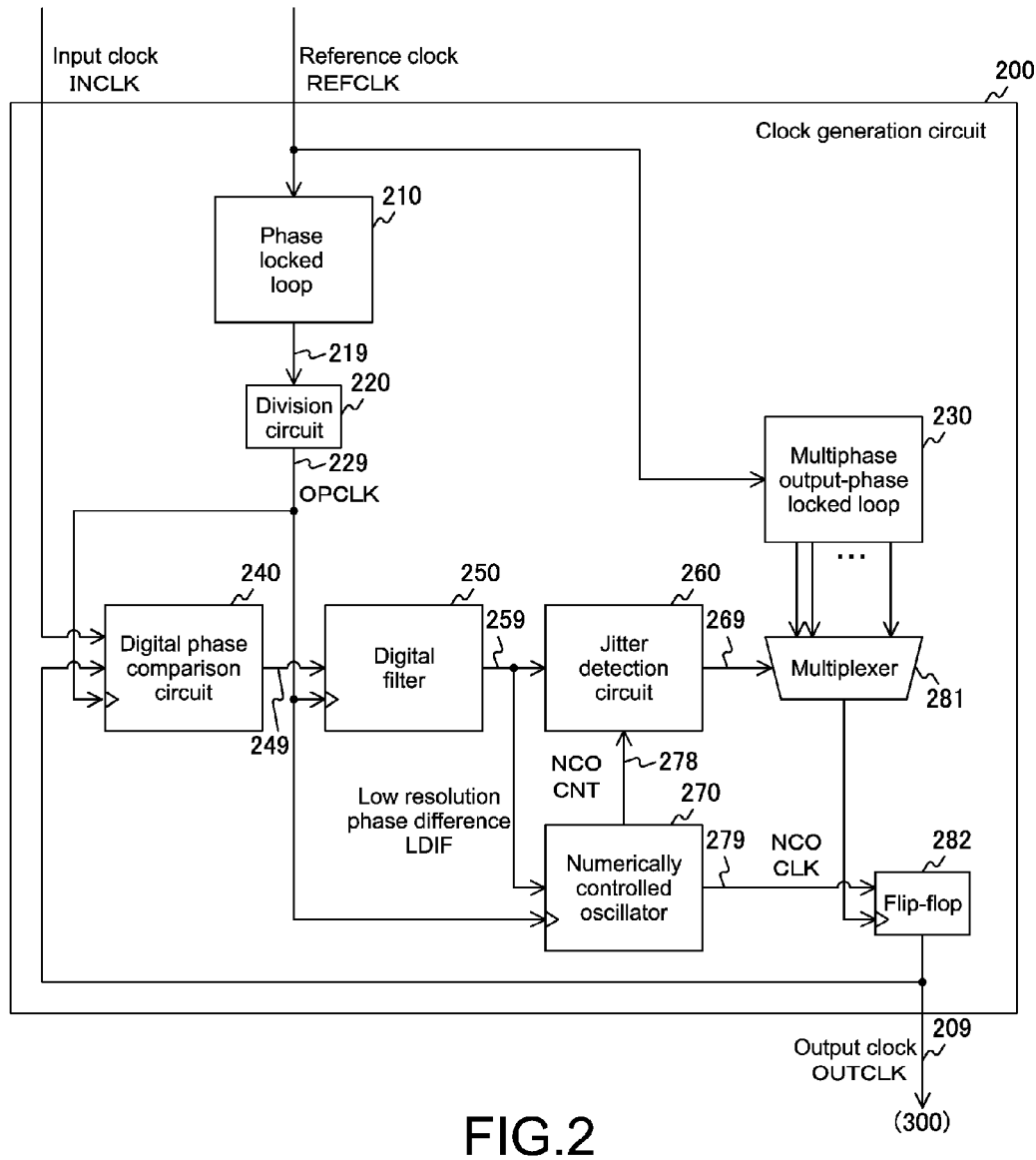
FIG. 2 is a block diagram showing a configuration example of a clock generation circuit according to the first embodiment.

FIG. 2 is a block diagram showing a configuration example of the clock generation circuit 200 according to the first embodiment. The clock generation circuit 200 includes a phase locked loop 210, a division circuit 220, a multiphase output-phase locked loop 230, a digital phase comparison circuit 240, a digital filter 250, a jitter detection circuit 260, and a numerically controlled oscillator 270. Moreover, the clock generation circuit 200 includes a multiplexer 281 and a flip-flop 282.

The phase locked loop 210 is configured to multiply the frequency of the reference clock signal REFCLK. The phase locked loop 210 is configured to supply the reference clock signal REFCLK having the multiplied frequency to the division circuit 220 via a signal line 219.

The division circuit 220 is configured to divide the frequency of the reference clock signal REFCLK supplied from the phase locked loop 210. The division circuit 220 is configured to supply the clock signal having the divided frequency as an operation clock signal OPCLK to the digital phase comparison circuit 240, the digital filter 250, and the numerically controlled oscillator 270 via a signal line 229.

It should be noted that a circuit including the phase locked loop 210 and the division circuit 220 is an example of an operation signal generation circuit according to an embodiment of the present disclosure.

Here, the reference of the reference clock signal REFCLK is assumed to be $F_{REF}$, the multiplication ratio of the phase locked loop 210 is assumed to be $m_1$, and the division ratio of the division circuit 220 is assumed to be $n_1$. A frequency $F_{OP}$ of the operation clock signal OPCLK is represented by $F_{REF} \times m_1/n_1$. The values of $m_1$ and $n_1$ are set so that the frequency $F_{OP}$ is at least higher than a frequency $F_{IN}$ of an input clock signal.

The multiphase output-phase locked loop 230 is configured to generate M (M represents an integer of 2 or more) oscillation signals VCOCLK having different phases based on the reference clock signal REFCLK. The multiphase output-phase locked loop 230 is configured to supply the oscillation signals VCOCLK to the multiplexer 281.

The digital phase comparison circuit 240 is configured to compare the phase of the input clock signal INCLK and the phase of the output clock signal OUTCLK, and to detect the phase difference therebetween as a low resolution phase difference LDIF. The digital phase comparison circuit 240 is configured to supply a phase difference signal that represents the detected low resolution phase difference LDIF to the digital filter 250 via a signal line 249. It should be noted that the digital phase comparison circuit 240 is an example of a phase comparison circuit according to an embodiment of the present disclosure. Moreover, the low resolution phase difference LDIF is an example of a "phase difference" according to an embodiment of the present disclosure.

The digital filter 250 is configured to perform a process for reducing a higher frequency component than a predetermined cutoff frequency in the phase difference signal (LDIF) in synchronization with the operation clock signal OPCLK. As the digital filter 250, an infinite impulse response (IIR) filter, or finite impulse response (FIR) filter is used, for example. The digital filter 250 is configured to supply the phase difference signal (LDIF) having the reduced high frequency component to the jitter detection circuit 260 and the numerically controlled oscillator 270 via a signal line 259.

The numerically controlled oscillator 270 is configured to generate a low-speed clock signal NCOCLK having a lower frequency than the oscillation signal VCOCLK based on the phase difference signal (LDIF). The numerically controlled oscillator 270 is configured to supply the generated low-speed clock signal NCOCLK to the flip-flop 282 via a signal line 279. Moreover, the numerically controlled oscillator 270 is configured to generate a count value NCOCNT by integrating a value that represents the phase difference signal (LDIF) in synchronization with the operation clock signal OPCLK, and to supply the generated count value NCOCNT to the jitter detection circuit 260 via a signal line 278. It should be noted that the numerically controlled oscillator 270 is an example of a low-speed signal generation circuit according to an embodiment of the present disclosure.

The jitter detection circuit 260 is configured to detect the jitter amount of the low-speed clock signal NCOCLK based on the phase difference signal (LDIF) and the count value NCOCNT. The jitter detection circuit 260 is configured to generate a control signal VCOTAP for instructing the output of any one of the oscillation signals VCOCLK based on the detected jitter amount. The jitter detection circuit 260 is configured to supply the control signal VCOTAP to the multiplexer 281 via a signal line 269. It should be noted that the jitter detection circuit 260 is an example of a detection circuit according to an embodiment of the present disclosure.

The multiplexer 281 is configured to select any one of the oscillation signals VCOCLK and to supply the selected oscillation signal VCOCLK to the flip-flop 282 in accordance with the control signal VCOTAP. It should be noted that the multiplexer 281 is an example of a selection unit according to an embodiment of the present disclosure.

The flip-flop 282 is configured to hold the low-speed clock signal NCOCLK and to output the held low-speed clock signal NCOCLK as the output clock signal OUTCLK in synchronization with the oscillation signal VCOCLK supplied from the multiplexer 281. The output clock signal OUTCLK is supplied to the logic circuit 300 and the digital phase comparison circuit 240. It should be noted that the flip-flop 282 is an example of an output unit according to an embodiment of the present disclosure.

Figure 3:
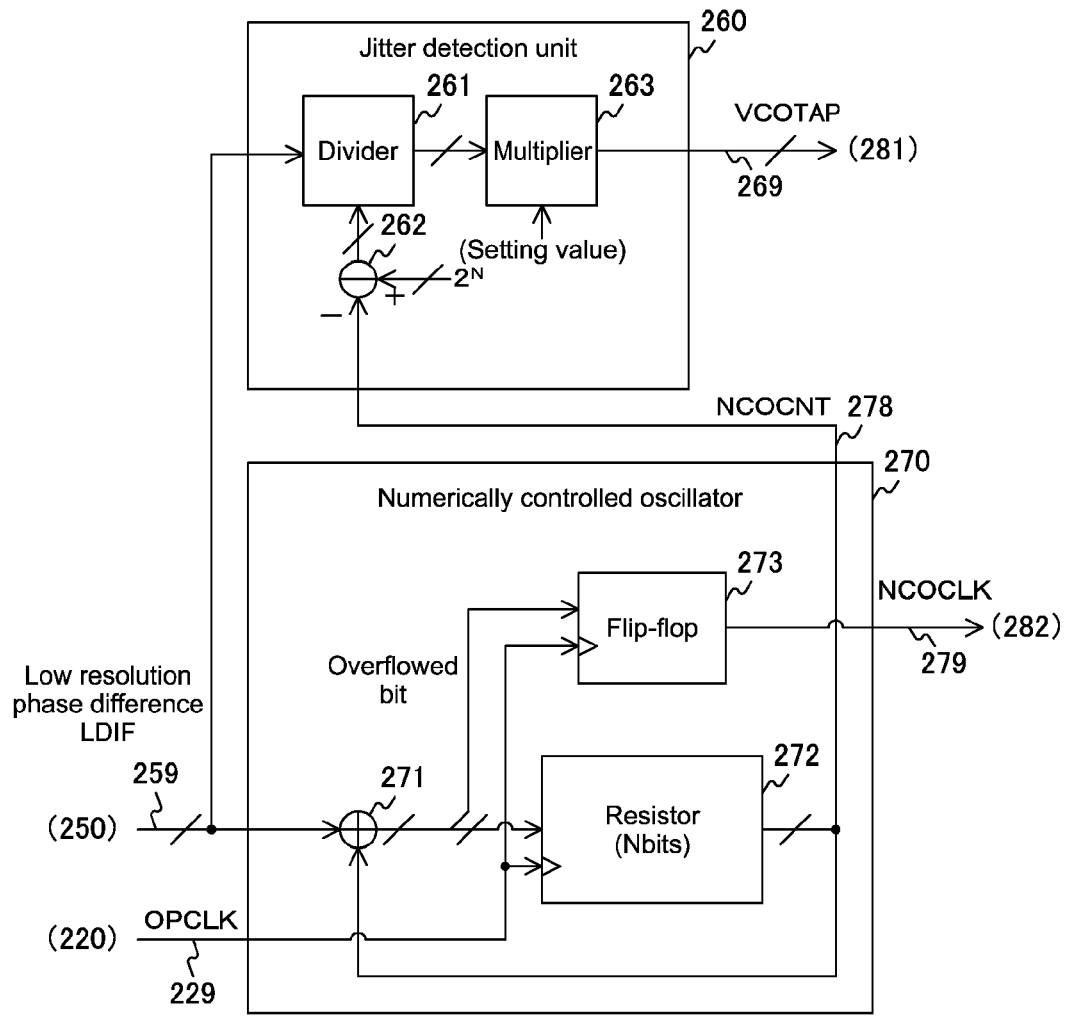
FIG. 3 is a block diagram showing a configuration example of a jitter detection circuit and a numerically controlled oscillator according to the first embodiment.

FIG. 3 is a block diagram showing a configuration example of the jitter detection circuit 260 and the numerically controlled oscillator 270 according to the first embodiment. The jitter detection circuit 260 includes a divider 261, a subtractor 262, and a multiplier 263. Moreover, the numerically controlled oscillator 270 includes an adder 271, a resistor 272, and a flip-flop 273.

The resistor 272 is configured to hold the count value NCOCNT and to supply the held count value NCOCNT to the adder 271 and the jitter detection circuit 260 in synchronization with the operation clock signal OPCLK. The size of data held by the resistor 272 is N (N represents an integer) bits, for example. Therefore, the maximum value of the count value NCOCNT is $2^N$.

The adder 271 is configured to add the value of a phase difference signal (DIF) to the count value NCOCNT supplied from the resistor 272. The adder 271 is configured to update the resistor 272 with the added value. Accordingly, the value of the input phase difference (LDIF) is integrated in synchronization with the operation clock signal OPCLK. Moreover, the adder 271 is configured to supply an overflowed bit representing whether or not the integration value exceeds $2_N$ and is rolled over to the flip-flop 273.

It should be noted that a circuit including the adder 271 and the resistor 272 is an example of an integrator according to an embodiment of the present disclosure.

The flip-flop 273 is configured to hold the overflowed bit supplied from the adder 271 and to output the held bit to the flip-flop 282 as the low-speed clock signal NCOCLK in synchronization with the operation clock signal OPCLK. It should be noted that the flip-flop 273 is an example of a low-speed signal generator according to an embodiment of the present disclosure.

As described above, by integrating the value of the phase difference signal (DIF) and outputting the overflowed bit of the integration value in synchronization with the operation clock signal OPCLK, the low-speed clock signal NCOCLK having a frequency depending on the low resolution phase difference LDIF is generated.

The subtractor 262 is configured to subtract the count value NCOCNT output from the resistor 272 from the maximum value $2^N$. The subtractor 262 is configured to supply the subtraction results to the divider 261.

The divider 261 is configured to divide the subtraction results supplied from the subtractor 262 by the value of the phase difference signal (LDIF) to obtain the remainder thereof. The divider 261 is configured to supply the calculated remainder to the multiplier 263.

The remainder corresponds to the difference between the maximum value of the count value NCOCNT in the cycle of the low-speed clock signal NCOCLK and $2^N$ that represents the reference timing, and represents the jitter amount of the low-speed clock signal NCOCLK.

It should be noted that the jitter detection circuit 260 is configured to perform calculation with the divider 261 and the subtractor 262. However, it is not limited to the configuration. The jitter detection circuit 260 may perform a process other than the above-mentioned calculation as long as the difference between the maximum value of the count value NCOCNT in the cycle of the low-speed clock signal NCOCLK and $2^N$ that represents the reference timing can be obtained.

The multiplier 263 is configured to multiply the division results by a predetermined setting value C and to output the multiplication results as the control signal VCOTAP representing any one of the oscillation signals VCOCLK. The divider 261, the subtractor 262, and the multiplier 263 are used to generate the control signal VCOTAP represented by the following formula 1:

$$VCOTAP = \{(2^N - NCOCNT) \bmod LDIF\} \times M.$$

In the formula, "mod" represents a function that divides a dividend by a divisor to return a remainder. Moreover, for a setting value M, the number of taps of the numerically controlled oscillator 270 is set, for example. With VCOTAP in the formula, the control signal VCOTAP that represents VCOCLK having the phase difference with respect to the reference clock signal REFCLK closest to the jitter amount is generated. The phase difference of the oscillation signal VCOCLK with respect to the reference clock signal REFCLK is detected with a higher resolution than the above-mentioned low resolution phase difference LDIF. Hereinafter, the phase difference is referred to as "high resolution phase difference HDIF." It should be noted that the high resolution phase difference HDIF is an example of a "phase difference" according to an embodiment of the present disclosure.

Configuration Example of Multiphase Output-Phase Locked Loop

Figure 4:
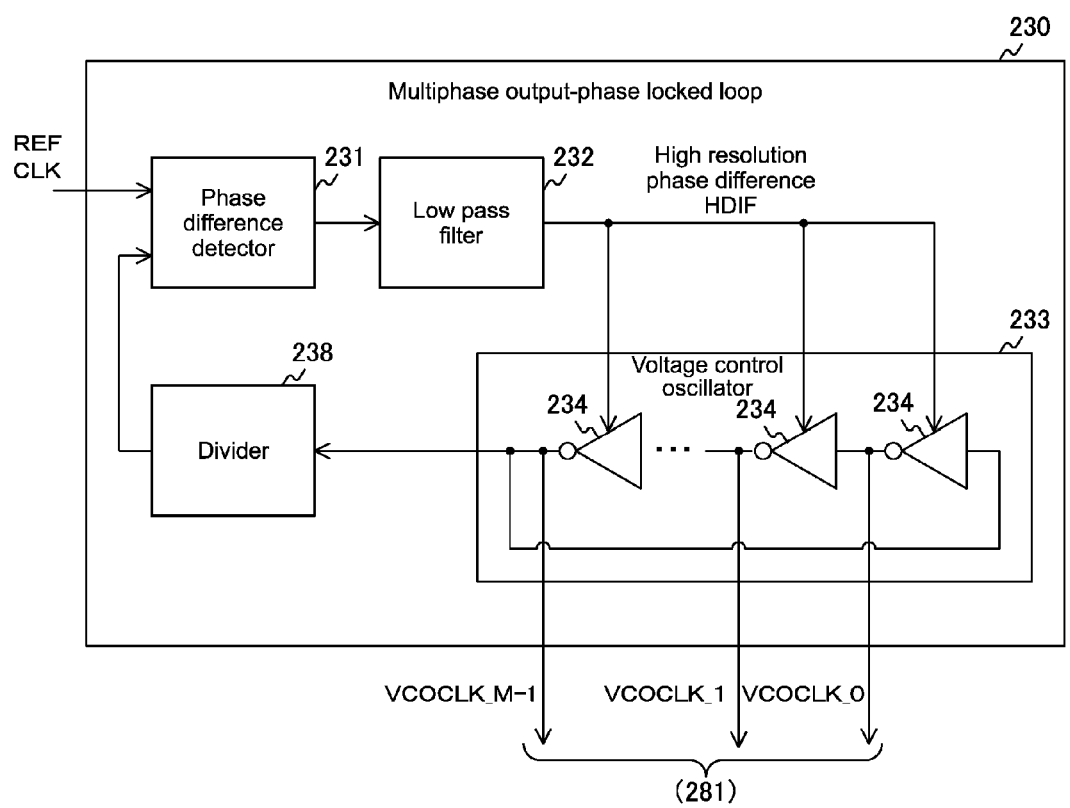
FIG. 4 is a block diagram showing a configuration example of a multiphase output-phase locked loop according to the first embodiment.

FIG. 4 is a block diagram showing a configuration example of the multiphase output-phase locked loop 230 according to the first embodiment. The multiphase output-phase locked loop 230 includes a phase difference detector 231, a low pass filter 232, a voltage control oscillator 233, and a divider 238. To the voltage control oscillator 233, a plurality of delay elements 234 connected annularly are provided.

The phase difference detector 231 is configured to compare the phase of a feedback signal and the phase of the reference clock signal REFCLK to detect the high resolution phase difference HDIF. The phase difference detector 231 is configured to supply a phase difference signal representing the detected high resolution phase difference HDIF to the low pass filter 232. By the phase difference signal, the delay time period of the delay element 234 is controlled.

The low pass filter 232 is configured to reduce a high frequency component higher than a predetermined cutoff frequency in the phase difference signal supplied from the phase difference detector 231. The low pass filter 232 is configured to supply the phase difference signal having the reduced high frequency component to the voltage control oscillator 233.

The delay element 234 is configured to delay the oscillation signal VCOCLK input from the delay element 234 in the front stage by the delay time period depending on the high resolution phase difference HDIF represented by the phase difference signal supplied from the low pass filter 232, and to supply the delayed oscillation signal VCOCLK to the delay element 234 in the back stage. As the delay element 234, an inverter is used, for example. Moreover, the respective delay elements 234 are configured to supply the oscillation signals VCOCLK to the multiplexer 281. Hereinafter, the oscillation signals are referred to as oscillation signals VCOCLK_0 to VCOCLK_M-1. Of the oscillation signals, the oscillation signal VCOCLK_M-1 is supplied to the divider 238 in addition to the multiplexer 281.

The divider 238 is configured to divide the frequency of the oscillation signal VCOCLK_M-1 supplied from the voltage control oscillator 233. The divider 238 is configured to provide feedback of the oscillation signal VCOCLK_M-1 having the divided frequency to the phase difference detector 231 as the feedback signal.

Configuration Example of Delay Element

Figure 5:
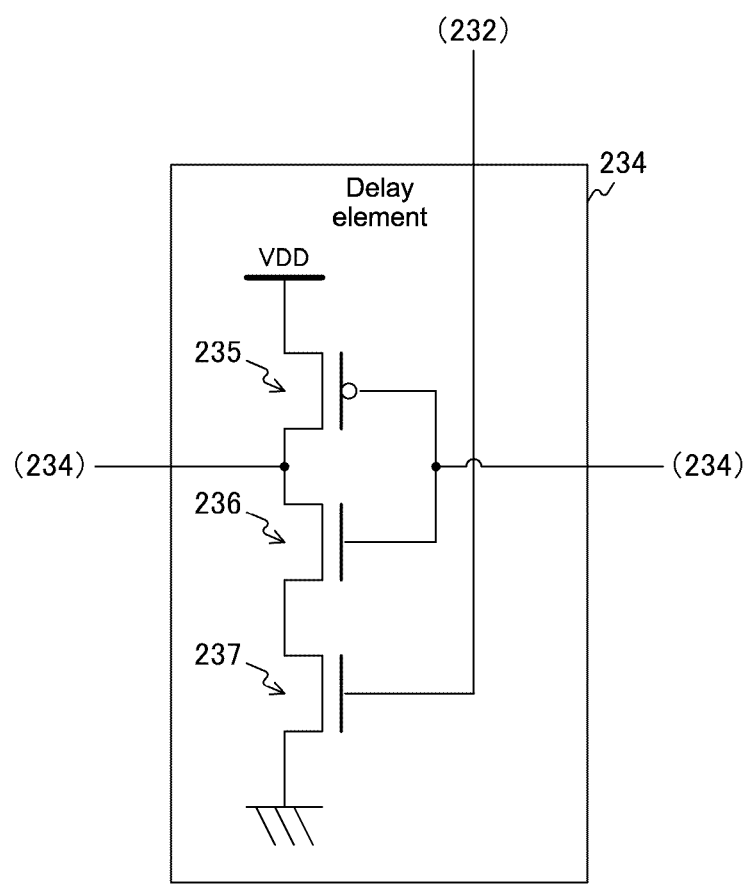
FIG. 5 is a circuit diagram showing a configuration example of a delay element according to the first embodiment.

FIG. 5 is a circuit diagram showing a configuration example of the delay element 234 according to the first embodiment. The delay element 234 includes transistors 235, 236, and 237. As the transistor 235, a p-type metal-oxide semiconductor (MOS) transistor is used, for example. Moreover, as the transistors 236 and 237, n-type MOS transistors are used, for example.

The gate terminal of the transistor 235 is connected to the delay element 234 in the front stage, the source terminal of the transistor 235 is connected to the delay element 234 in the back stage, and power supply voltage is applied to the drain terminal of the transistor 235. Moreover, the gate terminal of the transistor 236 is connected to the delay element 234 in the front stage, the source terminal of the transistor 236 is connected to the delay element 234 in the back stage, and the drain terminal of the transistor 236 is connected to the transistor 237. The gate terminal of the transistor 237 is connected to the low pass filter 232, the source terminal of the transistor 237 is connected to the transistor 236, and reference voltage lower than the power supply voltage is applied to the drain terminal of the transistor 237.

With the configuration, the clock signal input from the delay element 234 in the front stage is delayed by the delay time period depending on the high resolution phase difference HDIF and the delayed clock signal is output to the delay element 234 in the back stage.

(Exemplary Operation of Clock Generation Circuit)

Figure 6:
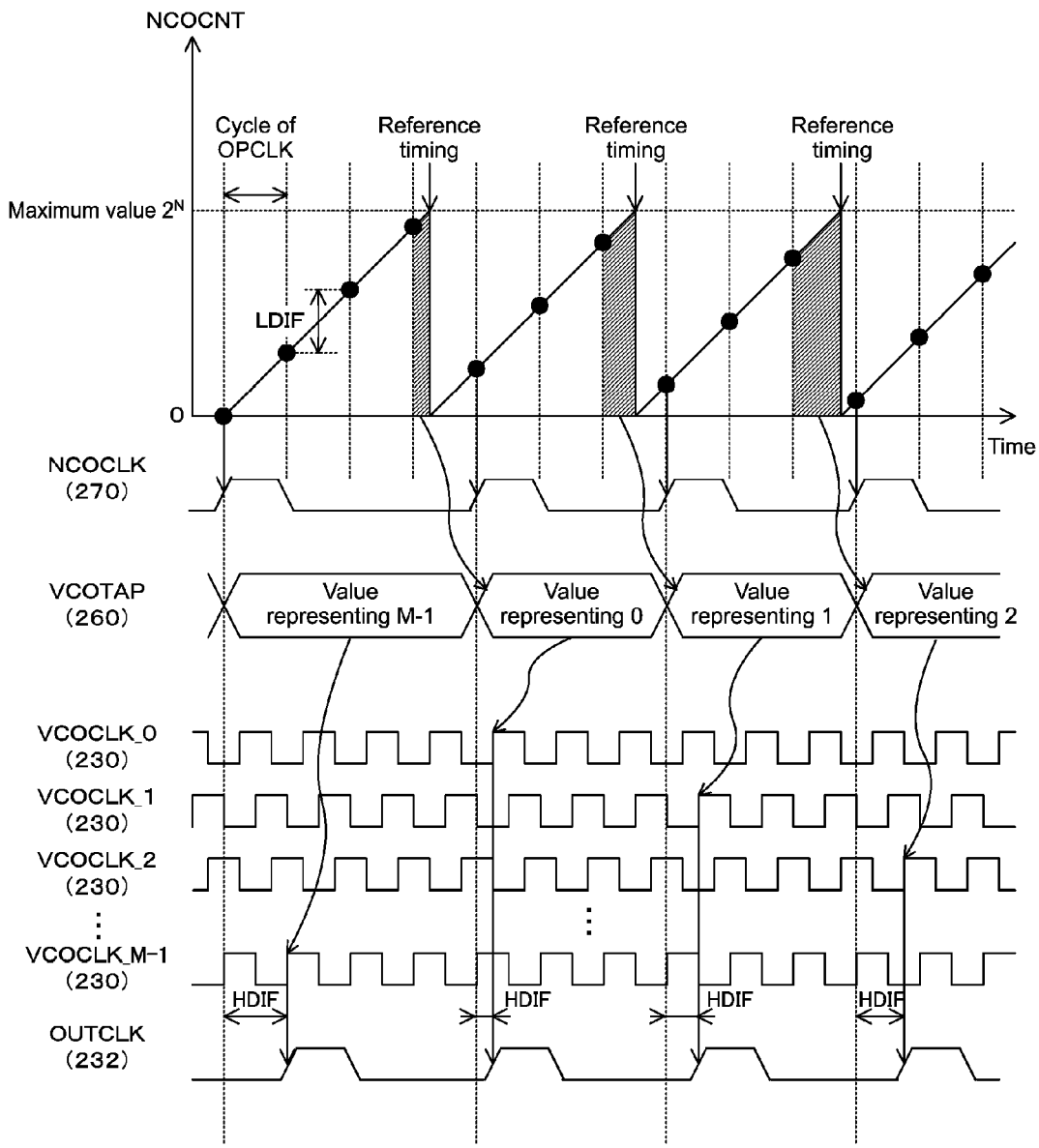
FIG. 6 is a timing chart showing an exemplary operation of the clock generation circuit according to the first embodiment.

FIG. 6 is a timing chart showing an exemplary operation of the clock generation circuit 200 according to the first embodiment. The vertical value in FIG. 6 represents the count value NCOCNT of the numerically controlled oscillator 270 in the clock generation circuit 200, and the horizontal axis represent time.

The numerically controlled oscillator 270 is configured to integrate the value of the phase difference signal (LDIF) in synchronization with the operation clock signal OPCLK. It should be noted that if jitter is not caused in the input clock signal INCLK, the phase difference signal (LDIF) is stable with a constant value representing the phase difference of 0 degree. Then, the interval of the timing when the integration vale (NCOCNT) of the constant DIF is overflowed (i.e., the edge position of the low-speed clock signal NCOCLK) is constant, and jitter is not caused in the low-speed clock signal NCOCLK. Hereinafter, the ideal edge position at which no jitter is caused is referred to as "reference timing."

On the other hand, if jitter is caused in the input clock signal INCLK, the phase difference signal DIF is not constant, and the edge position of the low-speed clock signal NCOCLK is displaced from the reference timing.

The jitter detection circuit 260 is configured to detect the phase deviation between the actual edge position of the low-speed clock signal NCOCLK and the reference timing as the jitter amount. The diagonal line in FIG. 6 represents the detected jitter amount. The jitter detection circuit 260 is configured to generate the control signal VCOTAP representing the oscillation signal VCOCLK having the high resolution phase difference HDIF with respect to the reference clock signal REFCLK, which is closest to the jitter amount.

For example, in the case where the jitter amount is the largest, the control signal VCOTAP representing the maximum oscillation signals VCOCLK_M-1 having the highest high resolution phase difference HDIF with respect to the reference clock signal REFCLK is generated. Moreover, in the case where the jitter amount is the smallest, the control signal VCOTAP representing the oscillation signals VCOCLK_0 having the smallest high resolution phase difference HDIF with respect to the reference clock signal REFCLK is generated.

The multiphase output-phase locked loop 230 is configured to generate the oscillation signals VCOCLK having different phases, and the flip-flop 282 is configured to output the output clock signal OUTCLK in synchronization with the oscillation signals VCOCLK represented by the control signal VCOTAP.

As described above, because retiming is performed on the low-speed clock signal NCOCLK by the oscillation signal VCOCLK having the high resolution phase difference HDIF with respect to the reference clock signal REFCLK closest to the jitter amount, jitter in the low-speed clock signal NCOCLK is reduced.

Figure 7:
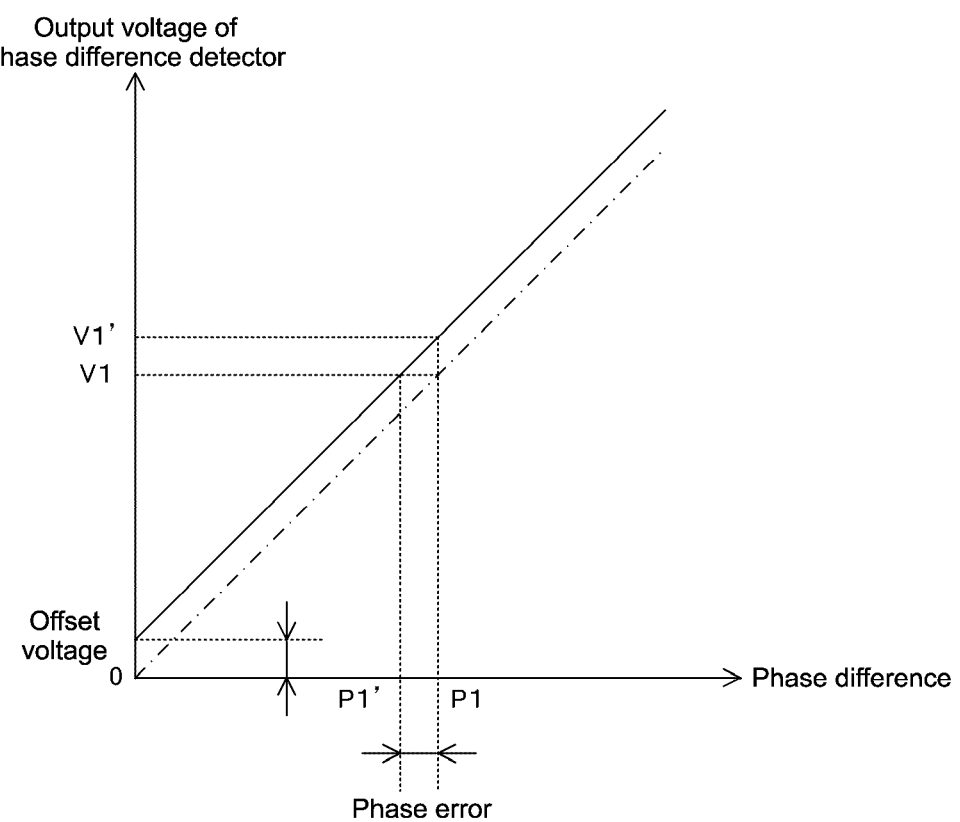
FIG. 7 is a graph showing an example of the relationship between a phase difference and output voltage of a phase difference detector according to the first embodiment.

FIG. 7 is a graph showing an example of the relationship between the phase difference and the output voltage of the phase difference detector 231 according to the first embodiment. In FIG. 7, the vertical axis represents the output voltage of the phase difference detector 231, and the horizontal axis represents the detected phase difference. Moreover, the alternate long and short dash line represents properties of ideal output voltage with no offset voltage, and the solid line represents properties of output voltage when offset voltage is caused. The offset voltage is caused due to various environmental factors such as a process, power supply voltage, and temperature. As shown in FIG. 7, an error occurs in the detected phase difference in the case where the offset voltage is caused. For example, a voltage V1 is output depending on a phase difference P1 in the case where no offset is caused. Here, if the offset is caused, a voltage V1' that is deviated by the amount of the offset depending on the phase difference P1 is output. Moreover, if the offset is caused, the voltage V1 is output depending on a phase difference P1' having an error instead of the actual phase difference P1.

Figure 8A:
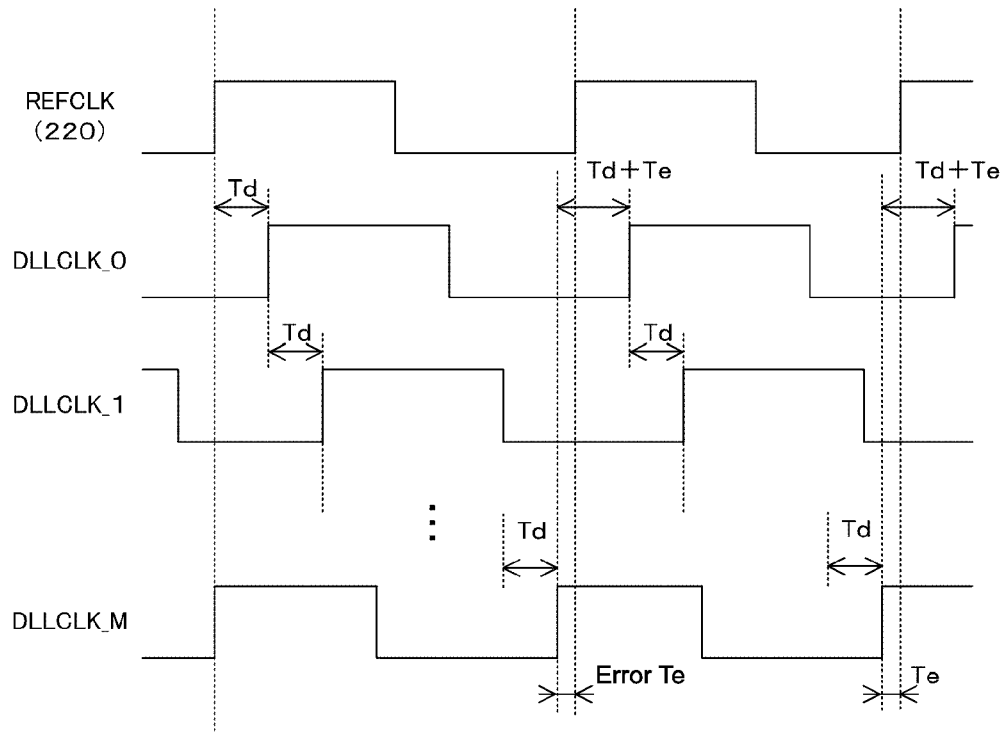
FIGS. 8A and 8B are each a timing chart showing respective exemplary operations of a voltage control oscillator according to the first embodiment and that in a comparative example.

FIG. 8 are each a timing chart showing respective exemplary operations of the voltage control oscillator 233 according to the first embodiment and that in a comparative example. FIG. 8A is a timing chart showing an exemplary operation according to the comparative example in which the DLL is provided instead of the multiphase output-phase locked loop 230 similarly to the description of Japanese Patent Application Laid-open No. 2013-005050. The DLL is configured to delay the reference clock signal REFCLK by the plurality of stages of delay elements, and to generate the oscillation signals DLLCLK_0 to DLLCLK_M-1 having different phases. Delay time periods Td of the oscillation signals are controlled to be a value depending on the phase difference between the DLLCLK_M-1 in the final stage and the reference clock signal REFCLK.

It should be noted that in the case where an error occurs in the phase difference detected by the phase detector in the DLL as shown in FIG. 7, the phase of the edge of the oscillation signal DLLCLK_M-1 in the final stage does not match the phase of the edge of the reference clock signal REFCLK due to the influence of the error. In the case where the error Te being the phase deviation is small, the phase difference detector detects the phase difference to be 0 degree regardless of the phase difference being not 0 degree but Te, and the delay time periods Td are not controlled, in some cases. In this case, the error Te occurs stationarily. As described above, an error that occurs stationarily is referred to as the stationary phase error. In the case where the stationary phase error occurs, the edge interval between the DLLCLK_M-1 in the final stage and the DLLCLK_0 in the first stage is not Td, and is Td+Te, for example. On the other hand, the edge interval between adjacent DLLCLK remains to be Td. As described above, because the respective edge intervals between the plurality of DLLCLK are not constant, jitter is caused in the output clock signal OUTCLK on which retiming is performed with the DLLCLK.

Figure 8B:
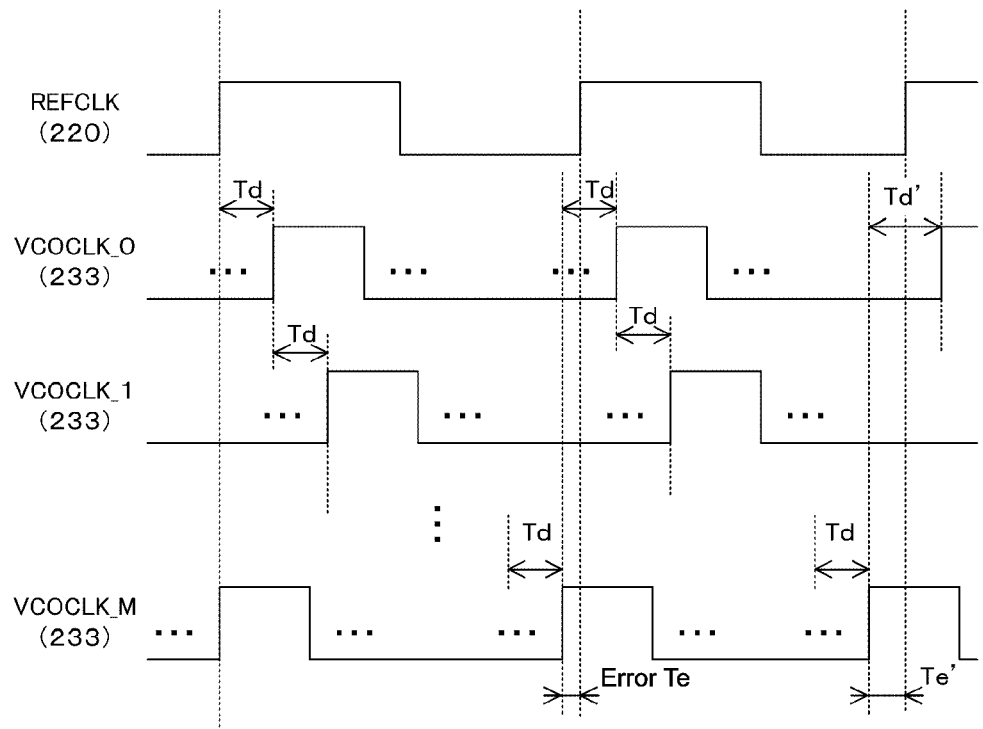

FIG. 8B is a timing chart showing an exemplary operation of the voltage control oscillator 233 according to the first embodiment. The voltage control oscillator 233 includes the delay elements 234 annularly connected to each other. Therefore, even if the error Te occurs between the edges of VCOCLK_M-1 in the final stage and the reference clock signal REFCLK, the edge interval between the DLLCLK_M-1 in the final stage and the VCOCLK_0 in the first stage is Td similarly to the edge interval between other adjacent oscillation signals. As described above, the respective edge intervals between the VCOCLK are constant in the voltage control oscillator 233, and the stationary phase error does not occur. Therefore, jitter in the output clock signal OUTCLK on which retiming is performed with the VCOCLK is reduced.

As described above, according to the first embodiment of the present disclosure, because the clock generation circuit 200 outputs a low-speed clock signal in synchronization with the oscillation signal generated by the voltage control oscillator 233 in which no stationary phase error occurs, it is possible to reduce jitter in the low-speed clock signal.

2. Second Embodiment

In the first embodiment, the operation clock signal OPCLK is generated by the phase locked loop 210 and the division circuit 220. However, instead of the phase locked loop 210 and the division circuit 220, the multiphase output-phase locked loop 230 and the division circuit 220 may generate the operation clock signal OPCLK. The clock generation circuit 200 according to the second embodiment is different from that in the first embodiment in that the multiphase output-phase locked loop 230 and the division circuit 220 generate the operation clock signal OPCLK.

Figure 9:
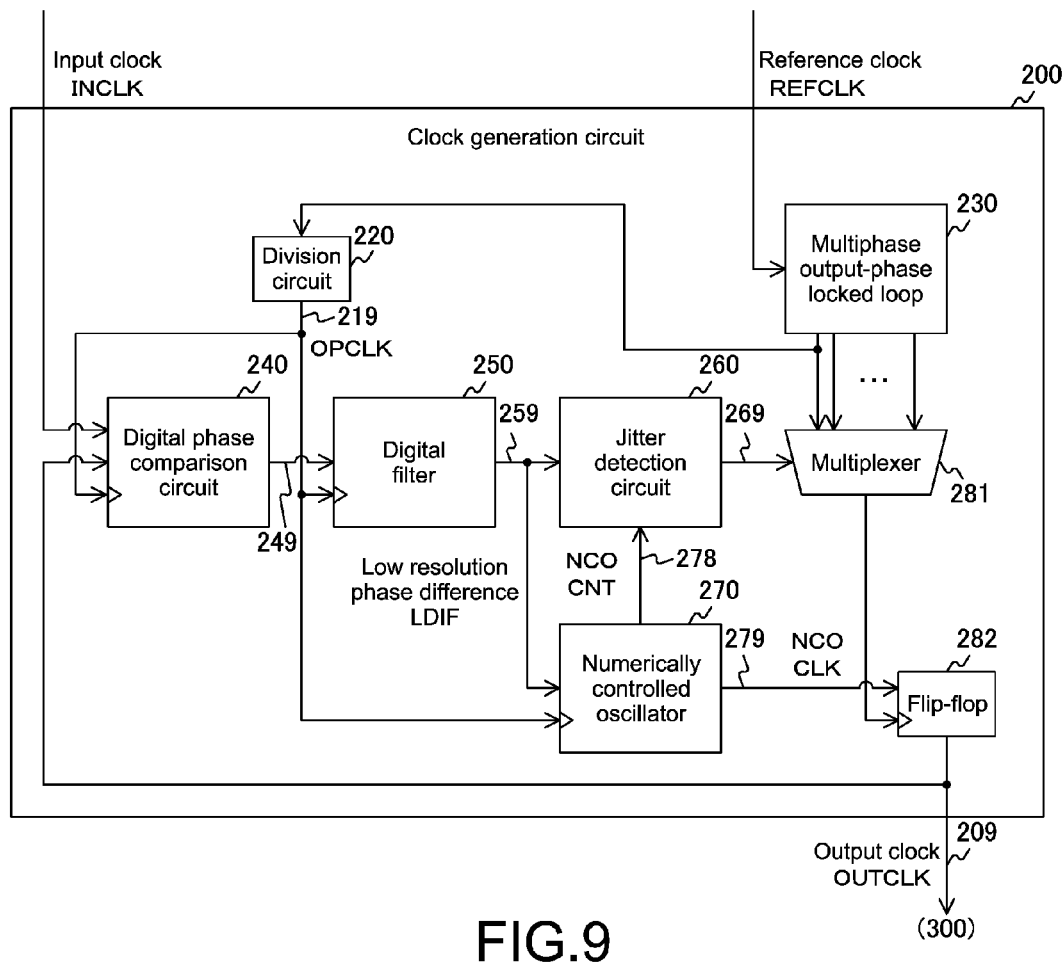
FIG. 9 is a block diagram showing a configuration example of a clock generation circuit according to a second embodiment of the present disclosure.

FIG. 9 is a block diagram showing a configuration example of the clock generation circuit 200 according to the second embodiment. The multiphase output-phase locked loop 230 according to the second embodiment is configured to multiply the reference clock signal REFCLK to generate a plurality of oscillation signals VCOCLK, and to supply any one of the oscillation signals VCOCLK to the division circuit 220.

The division circuit 220 according to the second embodiment is configured to divide the frequency of the oscillation signal VCOCLK supplied from the multiphase output-phase locked loop 230, and to supply the divided frequency to the digital phase comparison circuit 240, the digital filter 250, and the numerically controlled oscillator 270 as the operation clock signal OPCLK.

Here, the multiplication ratio of the multiphase output-phase locked loop 230 is assumed to be $m_2$, and the division ratio of the division circuit 220 is assumed to be $n_1$. The frequency $F_{OP}$ of the operation clock signal OPCLK is represented by $F_{REF} \times m_2/n_1$. The values of $m_2$ and $n_1$ are set so that the FOP is at least higher than the frequency $F_{IN}$ of the input clock signal.

As described above, according to the second embodiment, because the numerically controlled oscillator 270 is caused to operate with the operation clock signal that has divided any one of the oscillation signals, it is possible to cause the numerically controlled oscillator 270 to operate even if the phase locked loop 210 that generates the operation clock is not provided.

It should be noted that the embodiments of the present disclosure are shown as an example for implementing the present disclosure. The matters in the embodiments of the present invention have corresponding relations to the invention specifying matters in the claims. Similarly, the invention specifying matters in the claims have corresponding relations to the matters in the embodiments of the present invention having the same names as the invention specifying matters. It should be noted that the present disclosure is not limited to the above-mentioned embodiments and various modifications can be made without departing from the gist of the present disclosure.

It should be noted that the effects described above are not necessarily restrictive, and may be any of those described in the present disclosure.

It should be noted that the present disclosure may also take the following configurations.

(1) A signal generation circuit, including:
a phase difference detector configured to detect a phase difference between a certain oscillation signal of a plurality of oscillation signals and a predetermined reference signal;
an oscillator to which a plurality of delay elements are connected annularly, the oscillator being configured to generate the plurality of oscillation signals depending on the detected phase difference;
a low-speed signal generation circuit configured to generate a low-speed signal having a lower frequency than the oscillation signal;
a detection circuit configured to detect a difference between a predetermined reference timing and a timing at which the low-speed signal has changed;
a selection unit configured to select the oscillation signal so that the phase difference with respect to the reference signal is close to the detected difference; and
an output unit configured to output the generated low-speed signal in synchronization with the selected oscillation signal.

(2) The signal generation circuit according to (1) above, in which
the low-speed signal generation circuit is configured to generate the low-speed signal in synchronization with an operation signal that has divided any one of the plurality of oscillation signals.

(3) The signal generation circuit according to (1) above, further including
an operation signal generation circuit configured to generate a signal in synchronization with the reference signal as an operation signal, the low-speed signal generation circuit being configured to generate the low-speed signal in synchronization with the operation signal.

(4) The signal generation circuit according to any one of (1) to (3), in which
the low-speed signal generation circuit includes
an integrator configured to generate an integration value by integrating an input value in synchronization with a predetermined operation signal, and
a low-speed signal generator configured to generate, as the low-speed signal, a signal that represents whether or not the integration value exceeds a predetermined value representing the reference timing in synchronization with the operation signal, and
the detection circuit is configured to detect a difference between a maximum value of the integration value in a cycle of the low-speed signal and the predetermined value.

(5) The signal generation circuit according to any one of (1) to (4), further including
a phase comparison circuit configured to compare a phase of an input signal and a phase of the output low-speed signal, and to supply the phase difference there between, the low-speed signal generation circuit being configured to generate the low-speed signal based on the supplied phase difference.

(6) An electronic apparatus, including:
a phase difference detector configured to detect a phase difference between a certain oscillation signal of a plurality of oscillation signals and a predetermined reference signal;
an oscillator to which a plurality of delay elements are connected annularly, the oscillator being configured to generate the plurality of oscillation signals depending on the detected phase difference;
a low-speed signal generation circuit configured to generate a low-speed signal having a lower frequency than the oscillation signal;
a detection circuit configured to detect a difference between a predetermined reference timing and a timing at which the low-speed signal has changed;
a selection unit configured to select the oscillation signal so that the phase difference with respect to the reference signal is close to the detected difference;
an output unit configured to output the generated low-speed signal in synchronization with the selected oscillation signal; and
an operation circuit configured to operate in synchronization with the output low-speed signal.

It should be understood by those skilled in the art that various modifications, combinations, sub-combinations and alterations may occur depending on design requirements and other factors insofar as they are within the scope of the appended claims or the equivalents thereof.

What is claimed is:
1. A signal generation circuit, comprising:
a phase difference detector configured to detect a phase difference between a certain oscillation signal of a plurality of oscillation signals and a predetermined reference signal;
an oscillator to which a plurality of delay elements are connected annularly, the oscillator being configured to generate the plurality of oscillation signals depending on the detected phase difference;

a low-speed signal generation circuit configured to generate a low-speed signal having a lower frequency than the oscillation signal;

a detection circuit configured to detect a difference between a predetermined reference timing and a timing at which the low-speed signal has changed;

a selection unit configured to select the oscillation signal so that the phase difference with respect to the reference signal is close to the detected difference; and an output unit configured to externally output the generated low-speed signal in synchronization with the selected oscillation signal.

2. The signal generation circuit according to claim 1, wherein the low-speed signal generation circuit is configured to generate the low-speed signal in synchronization with an operation signal that has divided any one of the plurality of oscillation signals.

3. The signal generation circuit according to claim 1, further comprising an operation signal generation circuit configured to generate a signal in synchronization with the reference signal as an operation signal, the low-speed signal generation circuit being configured to generate the low-speed signal in synchronization with the operation signal.

4. The signal generation circuit according to claim 1, wherein the low-speed signal generation circuit includes
an integrator configured to generate an integration value by integrating an input value in synchronization with a predetermined operation signal, and
a low-speed signal generator configured to generate, as the low-speed signal, a signal that represents whether or not the integration value exceeds a predetermined value representing the reference timing in synchronization with the operation signal, and the detection circuit is configured to detect a difference between a maximum value of the integration value in a cycle of the low-speed signal and the predetermined value.

5. The signal generation circuit according to claim 1, further comprising a phase comparison circuit configured to compare a phase of an input signal and a phase of the output low-speed signal, and to supply the phase difference there between, the low-speed signal generation circuit being configured to generate the low-speed signal based on the supplied phase difference.

6. An electronic apparatus, comprising:

a phase difference detector configured to detect a phase difference between a certain oscillation signal of a plurality of oscillation signals and a predetermined reference signal;

an oscillator to which a plurality of delay elements are connected annularly, the oscillator being configured to generate the plurality of oscillation signals depending on the detected phase difference;

a low-speed signal generation circuit configured to generate a low-speed signal having a lower frequency than the oscillation signal;

a detection circuit configured to detect a difference between a predetermined reference timing and a timing at which the low-speed signal has changed;

a selection unit configured to select the oscillation signal so that the phase difference with respect to the reference signal is close to the detected difference;

an output unit configured to output the generated low-speed signal in synchronization with the selected oscillation signal; and an operation circuit configured to operate in synchronization with the output low-speed signal from the output unit.

7. The electronic apparatus according to claim 6, wherein the low-speed signal generation circuit is configured to generate the low-speed signal in synchronization with an operation signal that has divided any one of the plurality of oscillation signals.

8. The electronic apparatus according to claim 6, further comprising an operation signal generation circuit configured to generate a signal in synchronization with the reference signal as an operation signal, the low-speed signal generation circuit being configured to generate the low-speed signal in synchronization with the operation signal.

9. The electronic apparatus according to claim 6, wherein the low-speed signal generation circuit includes
an integrator configured to generate an integration value by integrating an input value in synchronization with a predetermined operation signal, and
a low-speed signal generator configured to generate, as the low-speed signal, a signal that represents whether or not the integration value exceeds a predetermined value representing the reference timing in synchronization with the operation signal, and the detection circuit is configured to detect a difference between a maximum value of the integration value in a cycle of the low-speed signal and the predetermined value.

10. The electronic apparatus according to claim 6, further comprising a phase comparison circuit configured to compare a phase of an input signal and a phase of the output low-speed signal, and to supply the phase difference there between, the low-speed signal generation circuit being configured to generate the low-speed signal based on the supplied phase difference.

* * * * *